United States Patent

Tomita et al.

Patent Number: 5,843,622
Date of Patent: Dec. 1, 1998

[54] LIQUID PHOTOSENSITIVE RESIN COMPOSITION FOR USE IN FORMING A RELIEF STRUCTURE

[75] Inventors: Hiroaki Tomita; Takashi Kobayashi, both of Fuji; Norihiko Sakata, Yokohama, all of Japan

[73] Assignee: Ashai Kasei Kogyo Kabushiki Kaisha, Osaka, Japan

[21] Appl. No.: 702,537

[22] PCT Filed: Mar. 3, 1995

[86] PCT No.: PCT/JP95/00354

§ 371 Date: Sep. 4, 1996

§ 102(e) Date: Sep. 4, 1996

[87] PCT Pub. No.: WO95/23998

PCT Pub. Date: Sep. 8, 1995

[30] Foreign Application Priority Data

Mar. 4, 1994 [JP] Japan ................................ 6-058378

[51] Int. Cl.$^6$ ............................................. G03F 7/027
[52] U.S. Cl. ................................ 430/284.1; 522/96
[58] Field of Search .......................... 430/284.1; 522/96

[56] References Cited

U.S. PATENT DOCUMENTS

| | | | |
|---|---|---|---|
| 3,960,572 | 6/1976 | Ibata et al. | 430/284.1 |
| 4,108,840 | 8/1978 | Friedlander | 528/46 |
| 4,131,602 | 12/1978 | Hodakowski et al. | 522/96 X |
| 5,336,585 | 8/1994 | Takahashi et al. | 430/284.1 |
| 5,338,613 | 8/1994 | Tomotsugu et al. | 522/96 X |

FOREIGN PATENT DOCUMENTS

| | | |
|---|---|---|
| 50-6403 | 1/1975 | Japan . |
| 60-10242 | 1/1985 | Japan . |
| 2-54710 | 3/1987 | Japan . |
| 63-90526A | 4/1988 | Japan . |
| 3-7717 | 1/1991 | Japan . |
| 4-95959 | 3/1992 | Japan . |

OTHER PUBLICATIONS

English translation of Kitayama et al, JP 63–090526 dated 19880421, United States Patent and Trademark Office, Jul. 1997, translated by FLS, Inc., Apr. 1998.

*Primary Examiner*—Cynthia Hamilton
*Attorney, Agent, or Firm*—Birch, Stewart, Kolasch & Birch, LLP

[57] ABSTRACT

Disclosed is a liquid photosensitive resin composition for use in forming a relief structure, comprising (A) an unsaturated polyurethane prepolymer comprising a plurality of diol segments comprising at least one polyester diol segment and at least one polyether diol segment, wherein the weight ratio of the at least one polyester diol segment to the at least one polyether diol segment is from 1:3 to 4:1, and wherein each of the at least one polyester diol segment is independently a polyester diol segment comprising recurring units of a unit represented by the following formula (1):

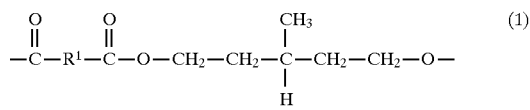

wherein $R^1$ represents a divalent aliphatic group or a divalent aromatic group, or a polyester diol segment comprising recurring units of a unit represented by the following formula (2):

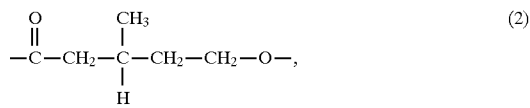

(B) an addition-polymerizable ethylenically unsaturated monomer, and (C) a photopolymerization initiator. When a relief structure is produced from the photosensitive resin composition of the present invention, the occurrence of the tunnel phenomenon in the relief portions of the produced relief structure can be suppressed, so that a relief structure (e.g., a printing plate) having improved durability can be obtained.

2 Claims, 1 Drawing Sheet

FIG.1

PRIOR ART

FIG.2

PRIOR ART

LIQUID PHOTOSENSITIVE RESIN COMPOSITION FOR USE IN FORMING A RELIEF STRUCTURE

BACKGROUND OF THE INVENTION

1. Field of The Invention

The present invention relates to a liquid photo-sensitive resin composition for use in forming a relief structure. More particularly, the present invention is concerned with a liquid photosensitive resin composition for use in forming a relief structure, comprising (A) an unsaturated polyurethane prepolymer comprising a plurality of diol segments linked through a urethane linkage and having an addition-polymerizable ethylenically unsaturated group at both terminals thereof, the plurality of diol segments comprising at least one polyester diol segment and at least one polyether diol segment, wherein the weight ratio of the at least one polyester diol segment to the at least one polyether diol segment is from 1:3 to 4:1, and wherein each of the at least one polyester diol segment is independently a polyester diol segment obtained by a polycondensation between a diol, which is comprised mainly of 3-methyl-1,5-pentane diol, and a dicarboxylic acid, or a polyester diol segment obtained by a ring-opening polymerization of a lactone comprised mainly of β-methyl-δ-valerolactone, (B) an addition-polymerizable ethylenically unsaturated monomer, and (C) a photopolymerization initiator. When the liquid photosensitive resin composition of the present invention is used for producing a relief structure, the occurrence of the tunnel phenomenon in the relief portions of a relief structure can be effectively suppressed, so that a relief structure in which the relief portions have no defect can be obtained. The liquid photosensitive resin composition of the present invention can be advantageously employed especially for producing a printing plate, such as a flexographic printing plate.

2. Prior Art

In place of conventional rubber printing plates, photoresin printing plates produced from a photosensitive resin have long been used for flexographic printing, such as for corrugated board printing or film printing. In the production of such a photoresin plate, a liquid photosensitive resin, which is in a liquid state before light exposure, is frequently employed because the use of a liquid photosensitive resin is advantageous. For example, a photoresin plate having a desired thickness can be easily produced; removal of the uncured resin is easy; and the removed uncured resin can be recovered and re-used for production of a photoresin plate and, hence, provides an economic advantage. From such a liquid photosensitive resin, a desired printing plate is generally prepared, using a plate-making apparatus, by a method comprising the steps of imagewise exposure, development, post-exposure and drying.

A liquid photosensitive resin for producing a flexographic printing plate is required to have not only low viscosity, good storage stability, good image reproducibility and good developability with an aqueous developer, but also the capability to provide a printing plate having excellent properties, such as high impact resilience, mechanical strength, ink resistance, ink receptivity and ink transferability. One of the important properties, which are especially required for a corrugated board printing plate, is impact resilience. The impact resilience of a corrugated board printing plate is required to be high.

For producing a photoresin relief having not only a good balance of mechanical properties, such as tensile strength, tensile elongation and hardness, but also excellent light stability, a liquid photosensitive resin based on a polyester-polyether polyurethane prepolymer, is widely employed [see, for example, Examined Japanese Patent Application Publication No. 52-7761 (corresponding to U.S. Pat. No. 3,960,572) and Unexamined Japanese Patent Application Laid-Open Specification No. 4-95959].

In the production of a relief printing plate from the above-mentioned liquid photosensitive resin based on a polyester-polyether polyurethane prepolymer, it is desired to achieve a large relief depth for the purposes of (1) increasing the amount of an uncured liquid resin which can be recovered and re-used, (2) decreasing the weight of a relief printing plate produced, and (3) eliminating a danger which is likely to occur when the relief depth formed is too small, namely, a danger such that, during a printing operation, ink which has been adhered to non-relief, non-image portions of the produced printing plate is disadvantageously transferred to prints being produced.

However, when the relief depth is too large, an unfavorable phenomenon (namely, tunnel phenomenon) occasionally occurs, wherein an unintentional tunnel-like through-hole (which is hereinafter, frequently referred to as "tunnel void") occurs as a defect at a middle and/or lower portion of the relief (as viewed along the height of the relief), in which the lower portion is near the back layer (see FIGS. 1 and 2). In general, the tunnel phenomenon tends to occur when the relief depth is greater than about 1.5 mm. The tunnel phenomenon frequently occurs when the relief depth is greater than about 2.0 mm. The tunnel phenomenon poses serious problems in practical printing operations, as described below. The morphology of a relief which is susceptible to tunnel phenomenon is varied. However, for example, when a conventional photosensitive resin is used for producing a relief structure (such as shown in FIGS. 1 and 2) having both line relief 2 of a relatively small width (line width: 100 to 500 µm) and solid-image relief 1 of a relatively large area, wherein line relief 2 has both of its ends connected to, and is positioned adjacent (within 1 cm or less) to, the solid-image relief 1, tunnel 3 is likely to occur at a lower portion of line relief 2, which lower portion is near back layer 6.

Figure 1:
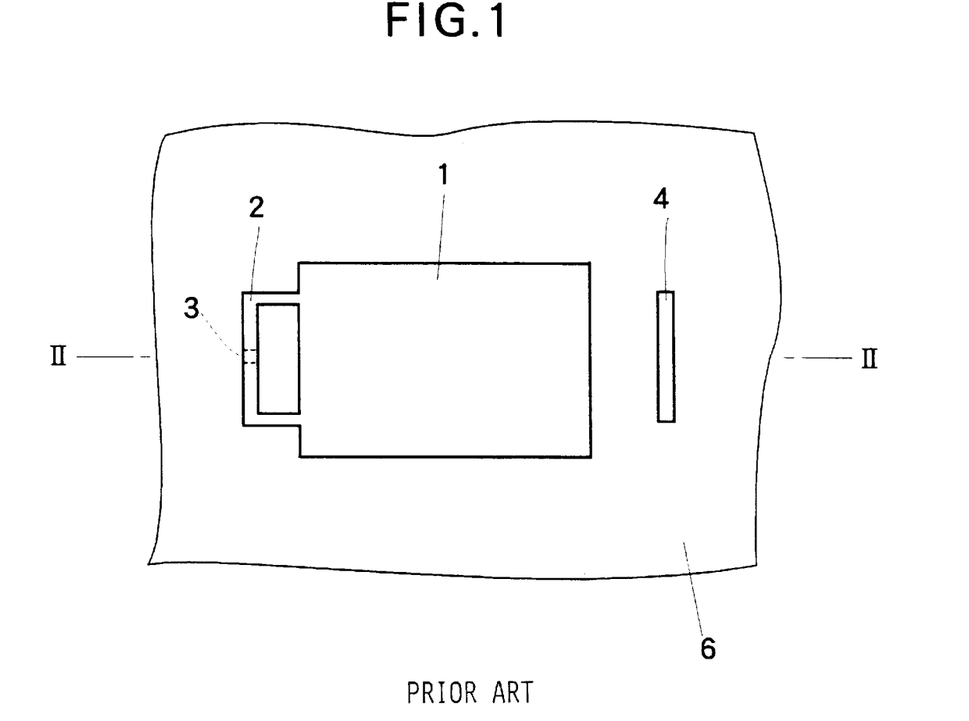
FIG. 1 is a diagrammatic plan view of one form of a printing plate having a relief suffering from a tunnel void.
Figure 2:
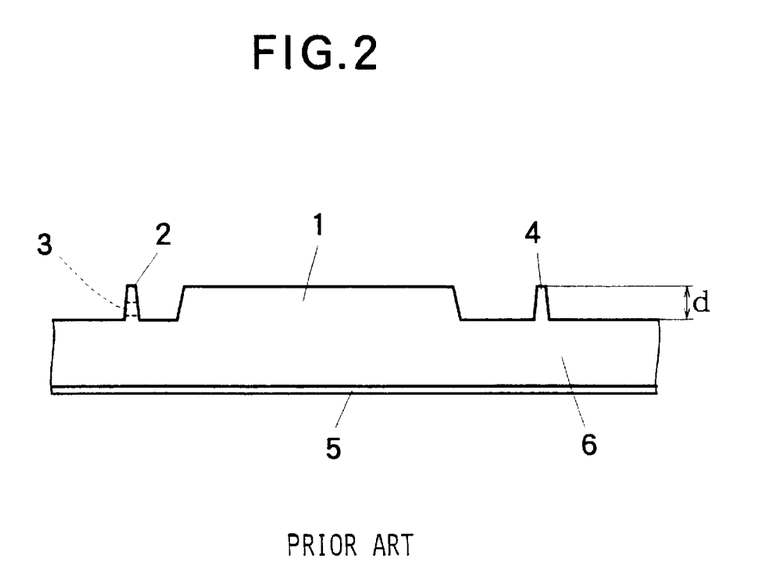
FIG. 2 is a diagrammatic cross-sectional view of FIG. 1, taken along line II—II.

FIGS. 1 and 2 are, respectively, a diagrammatic plan view and a diagrammatic cross-sectional view of a printing plate having a relief suffering from the tunnel phenomenon. In FIGS. 1 and 2, the printing plate has both line relief 2 having a relatively small width and solid-image relief 1 having a relatively large area, wherein line relief 2 has both of its ends connected to, and is positioned adjacent to, the solid-image relief 1. Line relief 2 has tunnel void 3. Numeral 4 designates a perfect line relief. Numeral 5 designates a support and numeral 6 designates a back layer. Character d designates the depth of the relief (relief depth). When such a relief plate having a tunnel is used as a printing plate, serious problems are likely to be encountered such that a sufficient printing pressure cannot be exerted on the defective relief portion having the tunnel. Accordingly, the ink receptivity and ink transferability of the relief portion becomes unsatisfactory or the defective relief portion is broken and comes off during the printing operation.

The occurrence of the tunnel phenomenon can be suppressed by increasing the time for imagewise exposure for producing a relief. However, an increase in the time for relief-forming exposure inevitably causes excessive exposure of the photosensitive resin, so that not only do the breadths or widths of screen dark portions (shadow portions) become large but also complicated fine letter portions of the relief disadvantageously join together and become indistinct; and the breadths or widths of the reverse image portions of the relief also disadvantageously become small. Thus, a relief pattern having a high image quality cannot be obtained.

In order to suppress the occurrence of the tunnel phenomenon, it has been proposed to incorporate a specific unsaturated amine compound into the liquid photosensitive resin based on a polyester-polyether polyurethane prepolymer (see Unexamined Japanese Patent Application Laid-Open Specification No. 3-157657 corresponding to U.S. Pat. No. 5,336,585). By the proposed method, the occurrence of the tunnel phenomenon can be suppressed. However, the unpleasant smell of the amine is emitted from the photosensitive resin composition containing the unsaturated amine compound, so that, when the plate-making operation is conducted, using such a photosensitive resin composition, in a workshop having no satisfactory ventilation equipment, the working environment becomes poor. Further, a problem also arises such that, due to the incorporation of an unsaturated amine, a lowering of the viscosity of the photosensitive resin composition during storage is disadvantageously promoted, so that when a plate-making operation is conducted using the photosensitive resin composition after storage, it becomes difficult to obtain a relief plate having high precision with respect to the thickness.

Therefore, it has been desired to provide a liquid photosensitive resin composition which is free from the above-mentioned disadvantages of the conventional liquid photosensitive resin composition based on a polyester-polyether polyurethane prepolymer. That is, it has been desired to provide a liquid photosensitive resin composition which is advantageous not only in that it is free from the occurrence of a tunnel phenomenon when used for producing a relief structure, but also in that a relief structure can be produced therefrom with high thickness precision of the relief structure produced and the production of the relief structure can be performed without deteriorating the working environment.

SUMMARY OF THE INVENTION

In these situations, the present inventors have made extensive and intensive studies. As a result, it has unexpectedly been found that the above-mentioned disadvantages of the conventional liquid photosensitive resin composition based on a polyester-polyether polyurethane prepolymer can be obviated by the use of a liquid photosensitive resin composition containing an unsaturated polyurethane prepolymer comprising a plurality of diol segments linked through a urethane linkage and having an addition-polymerizable ethylenically unsaturated group at both terminals thereof, wherein the plurality of diol segments comprise at least one polyester diol segment and at least one polyether diol segment, wherein the at least one polyester diol segment and the at least one polyether diol segment are present in such a specific weight ratio as mentioned above, and wherein each of the at least one polyester diol segment is independently a polyester diol segment obtained by a polycondensation between a diol, which is comprised mainly of 3-methyl-1,5-pentane diol, and a dicarboxylic acid, or a polyester diol segment obtained by a ring-opening polymerization of a lactone comprised mainly of β-methyl-δ-valerolactone. Based on the above finding, the present invention has been completed.

Accordingly, it is a primary object of the present invention to provide a liquid photosensitive resin composition for use in producing a relief structure, which composition is advantageous not only in that it can suppress the occurrence of a tunnel phenomenon and hence can be used for producing a relief structure in which relief portions are free from unintentional tunnel voids, but also in that a relief structure can be produced therefrom with high thickness precision of the relief structure produced and the production of the relief structure can be performed without deteriorating the working environment.

The foregoing and other objects, features and advantages of the present invention will be apparent from the following detailed description and appended claims taken in connection with the accompanying drawing.

BRIEF DESCRIPTION OF THE DRAWING

In the drawing:

In FIG. 1 and FIG. 2, like parts or portions are designated by like numerals. In FIG. 1 and FIG. 2, reference numerals designate the following parts or portions, and the reference character has the following meaning.

1 Solid-image relief having a relatively large area
2 Line relief having a relatively small width, which has both of its ends connected to and is positioned adjacent to solid-image relief 1
3 Tunnel void
4 Perfect line relief having no tunnel void
5 Support
6 Back layer
d Relief depth

DETAILED DESCRIPTION OF THE INVENTION

According to the present invention, there is provided a liquid photosensitive resin composition for use in forming a relief structure, comprising:

(A) 100 parts by weight of an unsaturated polyurethane prepolymer comprising a plurality of diol segments linked through a urethane linkage and having an addition-polymerizable ethylenically unsaturated group at both terminals thereof, the plurality of diol segments comprising at least one polyester diol segment and at least one polyether diol segment, wherein the weight ratio of the at least one polyester diol segment to the at least one polyether diol segment is from 1:3 to 4:1, and wherein each of the at least one polyester diol segment is independently a polyester diol segment comprising recurring units of a unit represented by the following formula (1):

wherein $R^1$ represents a divalent aliphatic group or a divalent aromatic group, or a polyester diol segment comprising recurring units of a unit represented by the following formula (2):

(B) 5 to 200 parts by weight, relative to 100 parts by weight of the polyurethane prepolymer (A), of an addition-polymerizable ethylenically unsaturated monomer, and (C) 0.01 to 10% by weight, based on the total weight of the component (A) and component (B), of a photopolymerization initiator.

The unsaturated polyurethane prepolymer used in the present invention is an unsaturated polyurethane prepolymer comprising a plurality of diol segments linked through a urethane linkage and having an addition-polymerizable ethylenically unsaturated group at both terminals thereof, wherein the plurality of diol segments comprise at least one polyester diol segment and at least one polyether diol segment.

The weight ratio of at least one polyester diol segment to at least one polyether diol segment is from 1:3 to 4:1, and each of at least one polyester diol segment is independently a polyester diol segment comprising recurring units of a unit represented by the above-mentioned formula (1), or a polyester diol segment comprising recurring units of a unit represented by the above-mentioned formula (2).

The polyester diol segment comprising recurring units of a unit represented by formula (1) is a polyester diol segment obtained by polycondensation between a diol comprised mainly of 3-methyl-1,5-pentane diol, and a dicarboxylic acid. The polyester diol segment comprising recurring units of a unit represented by formula (2) is a polyester diol segment obtained by a ring-opening polymerization of a lactone comprised mainly of β-methyl-δ-valerolactone.

When the liquid photosensitive resin composition of the present invention, which contains an unsaturated polyurethane prepolymer having at least one polyester diol segment selected from the group consisting of the polyester diol segment comprising recurring units of a unit represented by formula (1) and the polyester diol segment comprising recurring units of a unit represented by formula (2), is used for forming a relief printing plate, not only can the occurrence of the tunnel phenomenon be suppressed, but also the obtained relief printing plate has improved durability. The liquid photosensitive resin composition of the present invention not only has properties (such as appropriately low viscosity and satisfactory storage stability) which are required for a liquid photosensitive resin for use in producing a flexographic printing plate, but also can provide a flexographic printing plate which has properties (such as satisfactory mechanical strength, ink resistance, ink receptivity and ink transferability) which are required for a flexographic printing plate.

The diol to be subjected to a polycondensation with a dicarboxylic acid to obtain a polyester diol segment comprising recurring units of a unit represented by formula (1), may include a diol other than 3-methyl-1,5-pentane diol as long as the object and effects of the present invention can be achieved. However, for improving the effects of the present invention, it is preferred that 3-methyl-1,5-pentane diol be contained in a proportion as high as possible. Specifically, the amount of 3-methyl-1,5-pentane diol in the diol to be subjected to a polycondensation with a dicarboxylic acid is preferably 50% by weight or more, more preferably 80% by weight or more, based on the total weight of all diols. Examples of diols other than 3-methyl-1,5-pentane diol include a lower molecular weight diol, such as ethylene glycol, propylene glycol, 1,4-butane diol, 1,6-hexane diol, 1,9-nonane diol and diethylene glycol; and a high molecular weight polyether diol, such as polyoxyethylene glycol and polyoxypropylene glycol. Depending on the desired properties of the ultimate relief structure, a small amount of a polyhydric alcohol, such as trimethylol propane, glycerin and pentaerythritol may be contained together with 3-methyl-1,5-pentane diol. It is preferred that the amount of a polyvalent alcohol be not more than 20% by weight, based on the total weight of all polyester diols.

With respect to the dicarboxylic acid to be subjected to a polycondensation with a diol (which is comprised mainly of 3-methyl-1,5-pentane diol) to obtain a polyester diol segment comprising recurring units of a unit represented by formula (1), there is no particular limitation, and a conventional dicarboxylic acid can be used. Examples of dicarboxylic acids include succinic acid, glutaric acid, adipic acid, azelaic acid, sebasic acid, maleic acid, terephthalic acid and 1,5-naphthalenedicarboxylic acid. Of these, adipic acid, azelaic acid and sebasic acid are preferred. The above-mentioned dicarboxylic acids can be used individually or in combination. $R^1$ in formula (1) (i.e., a divalent aliphatic group or a divalent aromatic group) is derived from the above-mentioned dicarboxylic acid.

As mentioned above, the lactone to be subjected to a ring-opening polymerization to obtain a polyester diol segment comprising recurring units of a unit represented by formula (2), is comprised mainly of β-methyl-δ-valerolactone. The lactone may further comprise a lactone other than β-methyl-δ-valerolactone, as long as the excellent effects of the present invention are not impaired. However, for improving the effects of the present invention, it is preferred that the lactone to be subjected to a ring-opening polymerization reaction contain β-methyl-δ-valerolactone in an amount as large as possible. Specifically, it is preferred that the lactone comprise β-methyl-δ-valerolactone in an amount of 50% by weight or more, more preferably 80% by weight or more, based on the total weight of all lactones. Examples of lactones other than β-methyl-δ-valerolactone include β-propiolactone, γ-butyrolactone, δ-valerolactone and ε-caprolactone.

From the viewpoint of achievement of the excellent effects of the present invention, the polyester diol segment comprising recurring units of a unit of formula (1) and the polyester diol segment comprising recurring units of a unit of formula (2) are equivalent to each other and, hence, the unsaturated polyurethane prepolymer (A) may comprise either only one of the above-mentioned two different polyester diol segments, or both of them. When the unsaturated polyurethane prepolymer comprises both of the above-mentioned two different polyester diol segments, there is no particular limitation with respect to the weight ratio between the two different polyester diol segments, and they can be used in any weight ratio. Further, when the unsaturated polyurethane prepolymer comprises both of the above-mentioned two different polyester diol segments, the polyester diol segment comprising recurring units of a unit of formula (1) may be directly bonded to the polyester diol segment comprising recurring units of a unit of formula (2) at its terminal group derived from a dicarboxylic acid.

Examples of polyether diols which can be used for providing the polyether diol segment of the unsaturated polyurethane prepolymer include conventional polyether diols, such as polyoxyethylene glycol (PEG), polyoxypropylene glycol (PPG), polyoxyethylene-oxypropylene random or block copolymer diol, polyoxytetramethylene glycol (PTMG), polyoxyethylene-oxytetramethylene random or block copolymer diol, and polyoxypropylene-oxytetramethylene random or block copolymer diol. When the polyether diol segment contains an oxyethylene group represented by formula (4):

$$—CH_2—CH_2—O— \qquad (4)$$

in an amount of not smaller than 5% by weight, based on the weight of the unsaturated polyurethane prepolymer, an advantage can be obtained such that an uncured resin can be easily washed out from a photocured resin layer for development of a relief structure. However, when the amount of the above-mentioned oxyethylene group in the polyether diol segment is larger than 40% by weight, based on the weight of the unsaturated polyurethane prepolymer, the alcohol resistance and aqueous ink resistance of the printing plate obtained, which resistances are required to be high in a flexographic printing plate, become poor. Therefore, it is preferred that the amount of the above-mentioned oxyethylene group in the polyether diol segment be not larger than 40% by weight, more preferably 7 to 30% by weight, based on the weight of the unsaturated polyurethane prepolymer.

Examples of polyether diols which can be used for providing a polyether diol segment containing the oxyethylene group represented by formula (4) include polyoxyethylene glycol, a polyoxyethylene-oxypropylene random or block copolymer diol, and a polyoxyethylene-oxytetramethylene random or block copolymer diol.

In the present invention, the weight ratio of the at least one polyester diol segment to the at least one polyether diol segment in the unsaturated polyurethane prepolymer is from 1:3 to 4:1. When the weight ratio is less than 1:3, not only the mechanical strength but also the light stability of the photoresin plate obtained become poor. On the other hand, when the weight ratio is more than 4:1, the developability of an uncured resin becomes poor. It is preferred that the weight ratio of the at least one polyester diol segment to the at least one polyether diol segment be from 1:2 to 3:1.

From the viewpoint of ease in controlling a urethane-forming reaction, and the viewpoint of a good balance of the viscosity of the liquid photosensitive resin composition and the mechanical properties of the printing plate obtained, it is preferred that each of the polyester diol segment and the polyether diol segment have a number average molecular weight in the range of from 500 to 5,000. In the present invention, the number average molecular weight is measured by gel permeation chromatography (GPC) in which a calibration curve prepared using a standard polystyrene is employed.

As described above, the unsaturated polyurethane prepolymer (A) has a structure such that a plurality of diol segments comprising the above-mentioned at least one polyester diol segment and the above-mentioned at least one polyether diol segment, are linked through a urethane linkage. For linking diol segments through a urethane linkage, a conventional diisocyanate, such as an aromatic, aliphatic or alicyclic diisocyanate, is used. Illustrative examples of diisocyanates include 4,4'-diphenylmethane diisocyanate (MDI), p-phenylene diisocyanate, 2,4-tolylene diisocyante (2,4-TDI), 2,6-TDI, a mixture of 2,4-TDI and 2,6-TDI, 1,5-naphthalene diisocyanate (NDI), tolidine diisocyanate (TODI), hexamethylene diisocyanate (HMDI), isophorone diisocyanate (IPDI) and trimethylhexamethylene diisocyanate (TMDI). Of these diisocyanates, TDI, HMDI and IPDI are preferred. When it is desired to obtain a relief structure which does not suffer from discoloration or yellowing, non-aromatic diisocyanates are preferred.

The unsaturated polyurethane prepolymer used in the present invention has an addition-polymerizable ethylenically unsaturated group at both terminals thereof. With respect to the method for introducing the addition-polymerizable ethylenically unsaturated group, there is no particular limitation, and any of the conventional methods can be arbitrarily selected and employed. For example, there may be mentioned a method in which a polyester diol segment and a polyether diol segment are linked by means of a diisocyanate to obtain a precursor prepolymer, and both terminals of the precursor prepolymer are changed to isocyanate groups and the precursor prepolymer is reacted with a compound containing both a functional group having active hydrogen, such as a hydroxyl group, and an addition-polymerizable ethylenically unsaturated group, thereby obtaining a prepolymer having an addition-polymerizable ethylenically unsaturated group at both terminals thereof. Alternatively, there may be employed a method in which both terminals of the above-mentioned precursor prepolymer are changed to hydroxyl groups and the precursor prepolymer is then reacted with a compound which has both a functional group capable of reacting with a hydroxyl group, such as a carboxyl group, isocyanate group and epoxy group, and an addition-polymerizable ethylenically unsaturated group, thereby obtaining a prepolymer having an addition-polymerizable ethylenically unsaturated group at both terminals thereof.

Examples of the above-mentioned compound containing both a functional group having active hydrogen, such as a hydroxyl group, and an addition-polymerizable ethylenically unsaturated group (hereinafter, referred to as "unsaturated group introducing compound") include 2-hydroxyethyl (meth)acrylate, 2-hydroxypropyl (meth) acrylate, polyoxypropylene glycol mono(meth)acrylate (molecular weight: 300 to 1,000), polyoxyethylene glycol mono(meth)acrylate (molecular weight: 300 to 1,000), a 1:1 addition-polymerization reaction product of glycolic acid with glycidyl (meth)acrylate, a 1:1 addition-polymerization reaction product of glyceric acid with glycidyl (meth) acrylate, and glycerin di(meth)acrylate.

The unsaturated polyurethane prepolymer used in the present invention generally has a number average molecular weight in the range of from 5,000 to 30,000. In the present invention, the number average molecular weight is obtained by gel permeation chromatography (GPC) in which a calibration curve prepared using polystyrene is employed. When the number average molecular weight of the unsaturated polyurethane prepolymer is less than 5,000, a printing plate having both a Shore A hardness around 40 (required for performing flexographic printing) and a satisfactory tensile strength, and tensile elongation cannot be obtained. When the number average molecular weight of the unsaturated polyurethane prepolymer is more than 30,000, the viscosity of the liquid photosensitive resin composition becomes too high, so that the handling of the liquid photosensitive resin composition during the production thereof and a plate-making operation using the liquid photosensitive resin composition become difficult.

As the addition-polymerizable ethylenically unsaturated monomer, various conventional monomers can be used. The amount of the addition-polymerizable ethylenically unsaturated monomer in the composition of the present invention is 5 to 200 parts by weight, relative to 100 parts by weight of the polyurethane prepolymer. When the amount of the addition-polymerizable ethylenically unsaturated monomer is less than 5 parts by weight, the viscosity of the liquid photosensitive resin composition becomes too high, and it becomes difficult to obtain a printing plate having a good balance of hardness, tensile strength and tensile elongation.

When the amount of the addition-polymerizable ethylenically unsaturated monomer is more than 200 parts by weight, problems arise not only in that the photosensitive resin composition suffers a marked cure shrinkage at the time of photocuring, so that the printing plate obtained has poor precision with respect to the thickness of the plate, but also in that it becomes difficult to obtain a printing plate having a good balance of hardness, tensile strength and tensile elongation. From the viewpoint of ease in handling of the liquid photosensitive resin composition during a plate-making operation and the viewpoint of obtaining a printing plate having a good balance of hardness, tensile strength and tensile elongation, it is preferred that the amount of the addition-polymerizable ethylenically unsaturated monomer be 15 to 85 parts by weight, relative to 100 parts by weight of the polyurethane prepolymer.

Examples of addition-polymerizable ethylenically unsaturated monomers include unsaturated carboxylic acids, such as acrylic acid and methacrylic acid, and esters thereof (for example, alkyl acrylate, alkyl methacrylate, cycloalkyl acrylate, cycloalkyl methacrylate, alkyl halide acrylate, alkyl halide methacrylate, alkoxyalkyl acrylate, alkoxyalkyl methacrylate, hydroxyalkyl acrylate, hydroxyalkyl methacrylate, aminoalkyl acrylate, aminoalkyl methacrylate, tetrahydrofurfuryl acrylate, tetrahydrofurfuryl methacrylate, allyl acrylate, allyl methacrylate, glycidyl acrylate, glycidyl methacrylate, benzyl acrylate, benzyl methacrylate, phenoxy acrylate, phenoxy methacrylate; mono- or di-acrylate of alkylene glycol, mono- or di-methacrylate of alkylene glycol, mono- or di-acrylate of polyoxyalkylene glycol, mono- or di-methacrylate of polyoxyalkylene glycol; trimethylolpropane triacrylate, trimethylolpropane trimethacrylate; pentaerythritol tetraacrylate, and pentaerythritol tetramethacrylate and the like), acrylamides, methacrylamides and derivatives thereof (such as, an acrylamide N-substituted with an alkyl or hydroxyalkyl group, a methacrylamide N-substituted with an alkyl or hydroxyalkyl group, an acrylamide N,N-disubstituted with alkyl and/or hydroxyalkyl groups, a methacrylamide N,N-disubstituted with alkyl and/or hydroxyalkyl groups; diacetone acrylamide, diacetone methacrylamide; N,N'-alkylene-bis-acrylamide, and N,N'-alkylene-bis-methacrylamide and the like), allyl compounds (such as, allyl alcohol, allyl isocyanate, diallyl phthalate and triallyl cyanurate and the like), maleic acid, maleic anhydride, fumaric acid, and esters thereof (such as, mono- or di-alkyl maleate, mono- or di-alkyl fumarate, mono- or di-haloalkyl maleate, mono- or di-haloalkyl fumarate, mono- or di-alkoxyalkyl maleate, and mono- or di-alkoxyalkyl fumarate and the like), and other unsaturated compounds (such as, styrene, vinyltoluene, divinylbenzene, N-vinylcarbazole and N-vinyl-pyrrolidone and the like. These addition-polymerizable ethylenically unsaturated monomers may be employed individually or in combination.

In the flexographic printing of corrugated boards, for solving a problem such that paper dust (which is generated from corrugated boards during printing) adheres to the printing surface of a printing plate and hinders the printing operation, it is desired to produce a printing plate having high impact resilience. From the viewpoint of obtaining a printing plate having high impact resilience, it is preferred that the addition-polymerizable ethylenically unsaturated monomer comprise an acrylate monomer represented by the formula (3):

$$CH_2=CH-CO-O-(C_2H_4O)_n-R^2 \qquad (3)$$

in an amount in the range of from 17 to 65 parts by weight, relative to 100 parts by weight of the unsaturated polyurethane prepolymer. When the amount of the above-mentioned acrylate monomer is less than 17 parts by weight, a remarkable improvement in impact resilience cannot be achieved. When the amount of the above-mentioned acrylate monomer is more than 65 parts by weight, the image reproductivity and mechanical strength of the ultimate printing plate are lowered.

When the addition-polymerizable ethylenically unsaturated monomer comprises an acrylate monomer represented by the formula (3), the above-mentioned various addition-polymerizable ethylenically unsaturated monomers other than an acrylate monomer can also be used. In this case, it is preferred that the amount of the addition-polymerizable ethylenically unsaturated monomer other than the acrylate monomer be selected in the range of from 0 to 135 parts by weight, relative to 100 parts by weight of the unsaturated polyurethane prepolymer. From the viewpoint of obtaining a relief structure having a good balance of hardness, tensile strength and tensile elongation, it is more preferred that the amount of the other monomer be in the range of from 1 to 68 parts by weight.

In the formula (3), n represents the recurring number of the oxyethylene group, which is an integer of from 1 to 20. In general, the larger the value of n, the higher the impact resilience of the ultimate printing plate. However, when the value of n is too large, not only is the effect of the monomer for lowering the viscosity of a liquid resin (dilution effect), which is one of desired effects of a monomer component, lowered, but also the aqueous-ink resistance of the ultimate printing plate is lowered. Therefore, it is preferred that the value of n be not larger than 20. From the viewpoint of a good balance of the dilution effect of the monomer, and the impact resilience and ink resistance of the ultimate printing plate, it is more preferred that the value of n be in the range of from 2 to 10.

In the formula (3), $R^2$ represents a straight chain or branched alkyl group having 2 to 22 carbon atoms. Examples of such alkyl groups include an ethyl group, a propyl group, a butyl group, a pentyl group, an octyl group, an isooctyl group, a decyl group, an isodecyl group and a 2-ethylhexyl group and the like. When $R^2$ is a methyl group, which has only one carbon atom, the printing plate obtained has low resistance to aqueous ink. When $R^2$ is an alkyl group having more than 22 carbon atoms, the dilution effect of the acrylate monomer on the liquid resin is disadvantageously reduced. It is more preferred that $R^2$ be an alkyl group having 2 to 14 carbon atoms.

Specific examples of acrylate monomers represented in the formula (3) include ethyleneglycol ethylether acrylate, ethyleneglycol butylether acrylate, diethyleneglycol-2-ethylhexylether acrylate, nanoethyleneglycol laurylether acrylate, triethyleneglycol hexylether acrylate and the like. These acrylate monomers may be employed individually or in combination.

In the present invention, impact resilience is measured by a falling ball method as follows. Onto a sample plate, having a thickness of 7 mm, placed in an atmosphere at 20° C., an iron ball having a diameter of 8 mm is allowed to fall by gravity from the height of 30 cm above the plate. Then, the height above the plate (x: cm) reached by the ball which has bounced from the plate is measured. The impact resilience (%) is determined by the following formula.

impact resilience (%)=(x/30)×100

In the measurement, any surface tack of the sample plate affects the value of the impact resilience measured. Therefore, if the sample plate has any surface tack, the surface tack is removed, before carrying out the measurement, by covering the surface of the printing plate, onto which an iron ball will be dropped, with a powder, such as talc powder.

The photopolymerization initiator can be arbitrarily selected from those which are customarily used. Representative examples of photopolymerization initiators include benzoin; benzoin alkyl ethers, such as benzoin ethyl ether, benzoin-n-propyl ether, benzoin isopropyl ether and benzoin isobutyl ether; 2,2-di-methoxy-2-phenylacetophenone; benzophenone; benzil; diacetyl; diphenylsulfide; eosin; thionine; 9,10-anthraquinone; 2-ethyl-9,10-anthraquinone and the like.

These photopolymerization initiators may be used either individually or in combination. The amount of the photopolymerization initiator is selected in the range of from 0.01 to 10 wt %, based on the total weight of the unsaturated polyurethane prepolymer and addition-polymerizable ethylenically unsaturated monomer.

The liquid photosensitive resin composition of the present invention may further contain additives which are customarily used for known liquid photosensitive resins. Examples of such additives include a thermal polymerization inhibitor, an ultraviolet absorber, a light stabilizer, a dye, a pigment, a lubricant, an inorganic filler and a surfactant and the like.

A preferred example of the method for producing a relief printing plate by using the liquid photosensitive resin composition of the present invention is now explained below. The method comprises the steps of:

(1) lamination, in which an image-bearing negative film is disposed on a lower glass plate transparent to actinic rays, and covered with a thin transparent protective film; the photosensitive resin composition of the present invention is poured onto the protective film; and a base film as a support is laminated on the poured resin composition, while leveling the resin composition into a layer with a predetermined thickness by applying a pressure to the resin composition, then in either order for exposure;

(2) back exposure, in which the resin composition layer is exposed for a short period of time to actinic rays which are emitted from an upper light source to form a thin cured layer (i.e., back layer) of the resin composition having a uniform thickness in the resin layer over the entire area facing the support, and (3) relief exposure, in which the resin composition layer is imagewise exposed to actinic rays which are emitted from a lower light source through the transmitting pattern of the image-bearing negative film to form a relief portion;

(4) development of the exposed resin composition layer, in which the uncured resin composition is removed from the cured resin; and (5) post-exposure in water, in which the thus obtained relief plate is completely immersed in water and exposed to actinic rays emitted from a light source to perform a complete curing of portions of the plate which are not completely cured, and taking the completely cured relief plate out of the water and drying the plate.

When the thickness of the final photoresin relief plate is 4 mm or more, it is preferred that the above method further comprise, before the relief exposure, the step of masking exposure in which the support side of the resin layer is selectively photocured, using an upper light source, to form a shelf portion which is to be a support for the relief portion which is later formed (see, for example, U.S. Pat. No. 5,213,949). In this case, a relief printing plate can be produced by conducting lamination, masking exposure, relief exposure, back exposure, development, post-exposure in water and drying, for example, in this order.

In the above-mentioned method for producing a relief printing plate, as a light source of actinic rays for the exposures, there may be used, for example, a high pressure mercury lamp, an ultra-high pressure mercury lamp, an ultraviolet fluorescent lamp, a carbon arc lamp or a xenon lamp.

Representative examples of image-bearing transparencies used for the formation of a relief include a negative or positive film of the same type as used in a photographic process using a silver salt image.

Representative examples of washing liquids (developer) for washing out an uncured resin composition include water; an aqueous alkali solution, and an aqueous solution of a surfactant.

The liquid photosensitive resin composition of the present invention for use in forming a relief structure can be advantageously used not only for the production of a flexographic printing plate but also for the production of other photoresin plates, such as a stamp plate capable of providing excellent stamping feeling and having excellent ink receptivity and ink transferability.

When the liquid photosensitive resin composition of the present invention is used for producing a relief printing plate, the occurrence of the tunnel phenomenon in the relief portions of a relief printing plate can be effectively suppressed, so that a relief printing plate having high durability can be obtained. Also, the printing plate obtained has high mechanical strength which is required for flexographic printing, and excellent light resistance. Furthermore, the liquid photosensitive resin composition of the present invention has an advantage such that an uncured resin can be easily washed out from a photocured resin layer for development of a relief structure.

BEST MODE FOR CARRYING OUT THE INVENTION

Hereinbelow, the present invention will be described in more detail with reference to the following Reference Examples, Comparative Reference Examples, Examples and Comparative Examples, but they should not be construed as limiting the scope of the present invention.

In the following Reference Examples and Comparative Reference Examples, the hydroxyl value is determined according to the acetic anhydride-pyridine method.

REFERENCE EXAMPLE 1

Production of unsaturated polyurethane prepolymer A 0.13 mol of poly(3-methyl-1,5-pentanediol adipate) diol (hydroxyl value: 37.40), 0.48 mol of polyoxyethylene (EO) -oxypropylene (PO) block copolymer diol (EO/PO molar ratio=1:4, hydroxyl value: 44.88) and 0.09 g of dibutyltin dilaulate (hereinafter referred to simply as "BTL") as a catalyst were charged in a glass reactor, and mixed well at 40° C. To the resultant mixture was added 0.72 mol of tolylene diisocyanate (hereinafter referred to simply as "TDI") which was a mixture of 2,4-TDI and 2,6-TDI (2,4-TDI/2,6-TDI molar ratio=4:1), and the resultant mixture was stirred well for 30 minutes. Then, the internal temperature of the reactor was elevated from 40° C. to 80° C., and a reaction was performed for about 5 hours to obtain a reaction mixture. To the obtained reaction mixture was added 0.93 mol of poly(oxypropylene) glycol monomethacrylate (molecular weight: 380) as an unsaturated group introducing compound, and a reaction was conducted for about 2 hours while stirring to thereby obtain unsaturated polyurethane prepolymer A.

The above-mentioned unsaturated group introducing compound was used in excess of the stoichiometric amount. Therefore, the obtained unsaturated polyurethane prepolymer A contained a residue of the unsaturated group introducing compound in an amount corresponding to the additional amount over the stoichiometric amount. The number average molecular weight ($\overline{Mn}$) of unsaturated polyurethane prepolymer A was about $2.3 \times 10^4$, as measured by GPC under the conditions as described below[*1]. In unsaturated polyurethane prepolymer A, the weight ratio of a polyester diol segment comprising recurring units of a unit represented by formula (1) (hereinafter, frequently referred to as "polyester diol segment a") to a polyether diol segment was 1:3, as measured by the method described below[*2].

[*1] The number average molecular weight of unsaturated polyurethane prepolymer A was measured by GPC, in which a calibration curve prepared using a standard polystyrene was used. The measurement conditions were as follows: ① column: two polystyrene gel columns (TSK GEL GMHXL, 7.8 mm×300 mm, manufactured and sold by Tosoh Corp., Japan); ② solvent: THF (tetrahydrofuran) (containing no water); ③ flow rate: 1.0 ml/min; ④ sample concentration: 0.4 to 0.5 wt. %; ⑤ preparation of a calibration curve using a standard polystyrene: the concentration of the standard polystyrene was about ½ of the concentration of the sample; ⑥ the number of significant figures: two; ⑦ detector: a differential refractometer; ⑧ standard polystyrene: a polystyrene having a number average molecular weight of $5.00 \times 10^2$ to $1.26 \times 10^6$; and ⑨ GPC apparatus: high speed GPC HLC-8020 (manufactured and sold by Toso Corp., Japan).

[*2] The weight ratio of the polyester diol segment comprising recurring units of a unit represented by formula (1) to the polyether diol segment was determined as follows. First, the residue of the unsaturated group introducing compound (which was contained in unsaturated polyurethane prepolymer A because the compound had been used in excess of the stoichiometrical amount) was removed by GPC under the conditions as described below, to thereby purify unsaturated polyurethane prepolymer A. Subsequently, about 35 mg of the purified unsaturated polyurethane prepolymer A was dissolved in 1 ml of deuterated chloroform containing 0.01 vol. % of tetramethyl silane. The resultant solution was analyzed by $^1$H-NMR under conditions as described below. From the $^1$H-NMR spectrum, the peaks ascribed to the constituents of unsaturated polyurethane prepolymer A, that is, the polyester diol segment, the polyether diol segment, a group derived from the diisocyanate and a group derived from the unsaturated group introducing compound, were obtained. Then, by integrating the peaks ascribed to the polyester diol segment and polyether diol segment, the weight proportions of the polyester diol segment and the polyether diol segment were determined. Thus, the weight ratio of the polyester diol segment to the polyether diol segment was obtained.

The conditions for GPC in item *2 above were as follows: ① apparatus: LC-08, manufactured and sold by Japan Analytical Industry Co., Ltd.; ② column: JAIGEL 2H-1H, manufactured and sold by Japan Analytical Industry Co., Ltd.; ③ detector: a differential refractometer; ④ flow rate: 3.3 ml/min; and ⑤ solvent: chloroform.

The conditions for NMR in item *2 above were as follows: ① apparatus: JNM-GX400, manufactured and sold by JEOL LTD., Japan; ② frequency used for observation: 400 MHz; ③ width of spectrum observed: 4,000 Hz; ④ pulse: 13.5 μsec. (45°); and ⑤ measuring method: SG NON (Single pulse, Non-decoupling).

REFERENCE EXAMPLE 2

Production of unsaturated polyurethane prepolymer B 0.20 mol of poly(β-methyl-δ-valerolactone) diol (hydroxyl value: 56.10), 0.48 mol of polyoxyethylene (EO)-oxypropylene (PO) block copolymer diol (EO/PO molar ratio=1:4, hydroxyl value: 44.88) and 0.09 g of BTL as a catalyst were charged in a glass reactor, and mixed well at 40° C. To the resultant mixture was added 0.79 mol of TDI, and the resultant mixture was stirred well for 30 minutes. Then, the internal temperature of the reactor was elevated from 40° C. to 80° C., and a reaction was performed for about 5 hours to obtain a reaction mixture. To the obtained reaction mixture was added 0.93 mol of poly(oxypropylene) glycol monomethacrylate (molecular weight: 380) as an unsaturated group introducing compound, and a reaction was conducted for about 2 hours while stirring to thereby obtain unsaturated polyurethane prepolymer B.

The above-mentioned unsaturated group introducing compound was used in excess of the stoichiometric amount. Therefore, the obtained unsaturated polyurethane prepolymer B contained a residue of the unsaturated group introducing compound in an amount corresponding to the additional amount over the stoichiometric amount. The number average molecular weight ($\overline{Mn}$) of unsaturated polyurethane prepolymer B was about $2.3 \times 10^4$, as measured by GPC under the conditions as described in Reference Example 1 above. In unsaturated polyurethane prepolymer B, the weight ratio of a polyester diol segment comprising recurring units of a unit represented by formula (2) (hereinafter, frequently referred to as "polyester diol segment b") to a polyether diol segment was 1:3, as measured by the method described in Reference Example 1 above.

Comparative Reference Example 1

Production of unsaturated polyurethane prepolymer C 0.16 mol of poly(propylene glycol adipate) diol (hydroxyl value: 44.88), 0.48 mol of polyoxyethylene (EO)-oxypropylene (PO) block copolymer diol (EO/PO molar ratio=1:4, hydroxyl value: 44.88) and 0.32 g of BTL as a catalyst were charged in a glass reactor, and mixed well at 40° C. To the resultant mixture was added 0.75 mol of TDI, and the resultant mixture was stirred well for 30 minutes. Then, the internal temperature of the reactor was elevated from 40° C. to 80° C., and a reaction was performed for about 5 hours to obtain a reaction mixture. To the obtained reaction mixture was added 0.93 mol of poly(oxypropylene) glycol monomethacrylate (molecular weight: 380) as an unsaturated group introducing compound, and a reaction was conducted for about 2 hours while stirring to thereby obtain unsaturated polyurethane prepolymer C.

The above-mentioned unsaturated group introducing compound was used in excess of the stoichiometric amount. Therefore, the obtained unsaturated polyurethane prepolymer C contained a residue of the unsaturated group introducing compound in an amount corresponding to the additional amount over the stoichiometric amount. The number average molecular weight ($\overline{Mn}$) of unsaturated polyurethane prepolymer C was about $2.3 \times 10^4$, as measured by GPC under the conditions as described in Reference Example 1 above. In unsaturated polyurethane prepolymer C, the weight ratio of a polyester diol segment (hereinafter, frequently referred to as "polyester diol segment c") to a polyether diol segment was 1:3, as measured by the method described in Reference Example 1 above.

REFERENCE EXAMPLE 3
Production of unsaturated polyurethane prepolymer D 0.27 mol of poly(3-methyl-1,5-pentanediol adipate) diol (hydroxyl value: 37.40), 0.32 mol of polyoxyethylene (EO)-oxypropylene (PO) block copolymer diol (EO/PO molar ratio=1:4, hydroxyl value: 44.88) and 0.07 g of BTL as a catalyst were charged in a glass reactor, and mixed well at 40° C. To the resultant mixture was added 0.69 mol of TDI, and the resultant mixture was stirred well for 30 minutes. Then, the internal temperature of the reactor was elevated from 40° C. to 80° C., and a reaction was performed for about 4 hours to obtain a reaction mixture. To the obtained reaction mixture was added 0.93 mol of poly(oxypropylene) glycol monomethacrylate (molecular weight: 380) as an unsaturated group introducing compound, and a reaction was conducted for about 2 hours while stirring to thereby obtain unsaturated polyurethane prepolymer D.

The above-mentioned unsaturated group introducing compound was used in excess of the stoichiometric amount. Therefore, the obtained unsaturated polyurethane prepolymer D contained a residue of the unsaturated group introducing compound in an amount corresponding to the additional amount over the stoichiometric amount. The number average molecular weight ($\overline{Mn}$) of unsaturated polyurethane prepolymer D was about $2.3 \times 10^4$, as measured by GPC under the conditions as described in Reference Example 1 above. In unsaturated polyurethane prepolymer D, the weight ratio of polyester diol segment a to a polyether diol segment was 1:1, as measured by the method described in Reference Example 1 above.

REFERENCE EXAMPLE 4
Production of unsaturated polyurethane prepolymer E 0.40 mol of poly(β-methyl-δ-valerolactone) diol (hydroxyl value: 56.10), 0.32 mol of polyoxyethylene (EO)-oxypropylene (PO) block copolymer diol (EO/PO molar ratio=1:4, hydroxyl value: 44.88) and 0.07 g of BTL as a catalyst were charged in a glass reactor, and mixed well at 40° C. To the resultant mixture was added 0.83 mol of TDI, and the resultant mixture was stirred well for 30 minutes. Then, the internal temperature of the reactor was elevated from 40° C. to 80° C., and a reaction was performed for about 4 hours to obtain a reaction mixture. To the obtained reaction mixture was added 0.93 mol of poly(oxypropylene) glycol monomethacrylate (molecular weight: 380) as an unsaturated group introducing compound, and a reaction was conducted for about 2 hours while stirring to thereby obtain unsaturated polyurethane prepolymer E.

The above-mentioned unsaturated group introducing compound was used in excess of the stoichiometric amount. Therefore, the obtained unsaturated polyurethane prepolymer E contained a residue of the unsaturated group introducing compound in an amount corresponding to the additional amount over the stoichiometric amount. The number average molecular weight ($\overline{Mn}$) of unsaturated polyurethane prepolymer E was about $2.3 \times 10^4$, as measured by GPC under the conditions as described in Reference Example 1 above. In unsaturated polyurethane prepolymer E, the weight ratio of polyester diol segment b to a polyether diol segment was 1:1, as measured by the method described in Reference Example 1 above.

Comparative Reference Example 2
Production of unsaturated polyurethane prepolymer F 0.32 mol of poly(propylene glycol adipate) diol (hydroxyl value: 44.88), 0.32 mol of polyoxyethylene (EO)-oxypropylene (PO) block copolymer diol (EO/PO molar ratio=1:4, hydroxyl value: 44.88) and 0.32 g of BTL as a catalyst were charged in a glass reactor, and mixed well at 40° C. To the resultant mixture was added 0.75 mol of TDI, and the resultant mixture was stirred well for 30 minutes. Then, the internal temperature of the reactor was elevated from 40° C. to 80° C., and a reaction was performed for about 4 hours to obtain a reaction mixture. To the obtained reaction mixture was added 0.93 mol of poly(oxypropylene) glycol monomethacrylate (molecular weight: 380) as an unsaturated group introducing compound, and a reaction was conducted for about 2 hours while stirring to thereby obtain unsaturated polyurethane prepolymer F.

The above-mentioned unsaturated group introducing compound was used in excess of the stoichiometric amount. Therefore, the obtained unsaturated polyurethane prepolymer F contained a residue of the unsaturated group introducing compound in an amount corresponding to the additional amount over the stoichiometric amount. The number average molecular weight ($\overline{Mn}$) of unsaturated polyurethane prepolymer F was about $2.3 \times 10^4$, as measured by GPC under the conditions as described in Reference Example 1 above. In unsaturated polyurethane prepolymer F, the weight ratio of polyester diol segment c to a polyether diol segment was 1:1, as measured by the method described in Reference Example 1 above.

Examples 1 to 8 and Comparative Examples 1 and 2

As shown in Table 1, in Examples 1 to 8 and Comparative Examples 1 and 2, addition-polymerizable ethylenically unsaturated monomers, photopolymerization initiators and other additive were mixed with an unsaturated polyurethane prepolymer selected from unsaturated polyurethane prepolymers A to F obtained in the Reference Examples described above, to thereby obtain liquid photosensitive resin compositions.

With respect to the obtained liquid photosensitive resin compositions, evaluation of various properties was made as described below. Measurements for the evaluations were conducted at 20° C. unless otherwise specified.

① Occurrence of a tunnel void

A printing plate was produced from a liquid photosensitive resin composition, using a negative film bearing an image suitable for producing a relief structure (as shown in FIG. 1) having both line relief 2 of a relatively small width (line width: 500 μm) and solid-image relief 1 of a relatively large area, wherein line relief 2 has both of its ends connected to, and is positioned adjacent (within 1 cm) to, the solid-image relief 1. The plate-making apparatus employed was an APR plate-making apparatus (model AF210E, manufactured and sold by Asahi Chemical Industry Co., Ltd., Japan) having an upper light source and a lower light source. Under exposure conditions as indicated in Table 2, back exposure and relief exposure were conducted using the upper light source and lower light source of the apparatus, respectively. The thus produced printing plate had a thickness of 7 mm (including the thickness of a support), a relief depth of 2.5 mm and a thickness of the back layer of 4.5 mm (including the thickness of the support). As the support, a polyester film having a thickness of 100 μm and having an adhesive coated thereon was used. With respect to this printing plate, whether or not a tunnel void had occurred was examined by visually observing the printing plate.

② Retention of tensile properties (which is an index of the durability of a printing plate)

First, a sample plate was produced as follows. The liquid photosensitive resin composition was sandwiched between two soda-lime glass plates (each of which has a thickness of 4 mm and is covered with a thin protective film), wherein the glass plates had a 1-mm thickness spacer inserted therebetween and positioned along the peripheries of the glass plates, so that the thickness of the sandwiched liquid photosensitive resin composition was adjusted to a 1-mm thickness corresponding to the thickness of the spacer. The resultant photosensitive resin layer was exposed to actinic rays emitted from the upper light source and then the lower light source, wherein each light source was capable of providing a light intensity of 2.0 mW/cm$^2$, as measured on the surface of the glass plate before transmission of the actinic rays through the glass plate. The exposure was conducted for 30 minutes in total (15 minutes for each side of the photosensitive resin composition layer). Thus, a sample plate having a thickness of 1 mm was obtained. A plurality of specimens were cut out from the obtained sample plate. With respect to one half of the specimens, tensile properties (hereinafter referred to as "initial tensile properties") were measured in accordance with JIS K6301. The remaining one half of the specimens were allowed to stand for 1 month in a thermo-hygrostat, in which the temperature and relative humidity of the atmosphere were set at 50° C. and 80%, respectively. After that period of time, the specimens were taken out from the thermo-hygrostat and allowed to stand at 20° C. for 1 day. With respect to these specimens, the tensile properties (hereinafter referred to as "tensile properties after exposure to moist-heat atmosphere") were measured in the same manner as described above. The tensile properties after exposure to moist-heat atmosphere is expressed as a percentage, based on the initial tensile properties, and taken as a "retention of tensile properties".

③ Retention of hardness

A sample plate bearing a solid image and having a thickness of 7 mm (including the thickness of a support) was obtained in the same manner as in the preparation of a sample plate used for examination as to whether or not tunnel phenomenon has occurred. With respect to the obtained sample plate, the Shore A hardness (hereinafter referred to as "initial hardness") was measured. Measurement of the initial hardness was conducted using a Zwick automatic hardness meter (ASTM D2240). Specifically, continuous measurement of the hardness of the sample plate under a load of 8 kg was conducted, and the hardness of the sample plate at a point in time of 60 seconds after the start of the measurement was obtained. Subsequently, the sample plate used above was allowed to stand for 1 month in a thermo-hygrostat in which the temperature and relative humidity of the atmosphere were set at 50° C. and 80%, respectively. After that period of time, the sample plate was taken out and allowed to stand at 20° C. for 1 day. With respect to this sample plate, the Shore A hardness (hereinafter referred to as "hardness after exposure to moist-heat atmosphere") was measured. The hardness after exposure to most-heat atmosphere is expressed as a percentage, based on the initial hardness, and taken as a "retention of hardness".

With respect to the liquid photosensitive resin compositions of Examples 1 to 8 and Comparative Examples 1 and 2, various measurements were conducted by the above-mentioned methods. Results are shown in Table 3.

In the reliefs of the sample plates produced from the resin compositions of Examples 1 to 8, no occurrence of tunnel phenomenon was observed. In the reliefs of the sample plates produced from the resin compositions of Comparative Examples 1 and 2, as shown in FIG. 1 and FIG. 2, tunnel 3 occurred at a lower portion of relief 2, which lower portion is near back layer 6.

The sample plates produced from the resin compositions of Examples 1 to 8 exhibited high retention of tensile properties, namely, in the range of from 97 to 100%, and high retention of hardness, namely, in the range of from 97 to 99%. The sample plates produced from the resin compositions of Comparative Examples 1 and 2 exhibited low retention of tensile properties, namely, 78% and 81%, respectively, and low retention of hardness, namely, 80% and 79%, respectively.

The sample plates produced from the resin compositions of Examples 5 to 8 exhibited high impact resiliences, namely, in the range of from 50 to 58%, whereas the sample plates produced from the resin compositions of Examples 1 to 4 exhibited low impact resiliences, namely, in the range of from 28 to 35%.

TABLE 1

| Liquid photosensitive resin composition | Unsaturated polyurethane prepolymer | | Addition-polymerizable ethlenically unsaturated monomer | | Photo-polymerization initiator | | Additive | |
|---|---|---|---|---|---|---|---|---|
| | Type | *1) Amount (parts by weight) | Type | *2) Amount (parts by weight) | Type | *3) Amount (% by weight) | Type | *3) Amount (% by weight) |
| Example 1 | A | 100 | LMA | 15 | DMPAP | 0.6 | BHT | 0.5 |
| | | | PPMA | 30 | BP | 0.1 | | |
| | | | TEGDMA | 2.3 | | | | |
| | | | TMPTMA | 1.7 | | | | |
| Example 2 | B | 100 | same as above | | same as above | | same as above | |
| Comparative Example 1 | C | 100 | same as above | | same as above | | same as above | |
| Example 3 | D | 100 | same as above | | same as above | | same as above | |
| Example 4 | E | 100 | same as above | | same as above | | same as above | |
| Comparative Example 2 | F | 100 | same as above | | same as above | | same as above | |
| Example 5 | D | 100 | LMA | 6 | DMPAP | 0.6 | BHT | 0.5 |
| | | | PPMA | 15 | BP | 0.1 | | |
| | | | DEEHEA | 25 | | | | |

TABLE 1-continued

| Liquid photosensitive resin composition | Unsaturated polyurethane prepolymer | | Addition-polymerizable ethlenically unsaturated monomer | | Photo-polymerization initiator | | Additive | |
|---|---|---|---|---|---|---|---|---|
| | Type | *1) Amount (parts by weight) | Type | *2) Amount (parts by weight) | Type | *3) Amount (% by weight) | Type | *3) Amount (% by weight) |
| | | | TEGDMA | 2.3 | | | | |
| | | | TMPTMA | 1.7 | | | | |
| Example 6 | E | 100 | same as above | | same as above | | same as above | |
| Example 7 | D | 100 | TEBEA | 20 | same as above | | same as above | |
| | | | PPMA | 4 | | | | |
| | | | LMA | 4 | | | | |
| | | | TMPTMA | 2 | | | | |
| Example 8 | D | 100 | OEEHEA | 50 | DMPAP | 0.6 | BHT | 0.5 |
| | | | PPMA | 5 | BP | 0.1 | | |
| | | | LMA | 6 | | | | |
| | | | TEGDMA | 2.3 | | | | |
| | | | TMPTMA | 1.7 | | | | |

Notes for Table 1
Meanings of Abbreviations
LMA: lauryl methacrylate
PPMA: polypropylene glycol monomethacrylate ($\overline{M}n$: 400)
TEGDMA: tetraethylene glycol dimethacrylate
DEEHEA: diethylene glycol-2-ethylhexylether acrylate
OEEHEA: octaethylene glycol-2-ethylhexylether acrylate
TEBEA: triethylene glycol butylether acrylate
DMPAP: 2,2-dimethoxy-2-phenylacetophenone
BP: benzophenone
BHT: 2,6-di-t-butyl-p-cresol
*1) Indicated amount of the unsaturated polyurethane prepolymer is exclusive of the amount of a residue of the unsaturated group introducing compound which was used in excess of the stoichimetric amount, wherein the amount of a residue of the unsaturated group introducing compound corresponds to the additional amount used over the stoichimetric amount.
*2) Indicated amount of the addition-polymerizable ethylenically unsaturated monomer is inclusive of the amount of a residue of the unsaturated group introducing compound which was used in excess of the stoichimetric amount.
*3) Indicated amount is based on the total weight of the unsaturated polyurethane prepolymer and the addition-polymerizable ethylenically unsaturated monomer.

TABLE 2

| Liquid photosensitive resin composition | Back exposure (by upper light source) | | Relief exposure (by lower light source) | |
|---|---|---|---|---|
| | Light intensity*1) (mW/cm$^2$) | Exposure time (sec) | Light intensity*2) (mW/cm$^2$) | Exposure time (sec) |
| Examples 1, 2, 5, 6, 7 and 8, and Comparative Example 1 | 1.36 | 240 | 1.40 | 420 |
| Examples 3 and 4, and Comparative Example 2 | 1.36 | 270 | 1.40 | 420 |

*1)Intensity of ultraviolet light just after transmission thereof through upper glass plate
*2)Intensity of ultraviolet light just after transmission thereof through lower glass plate

TABLE 3

| | Type of polyester segment in unsaturated polyurethane polymer* | Weight ratio of polyester segment to polyether segment | Occurrence of tunnel in relief (depth of relief: 2.5 mm) | Retention of tensile properties (%) | Retention of hardness (%) | Impact resilience (%) |
|---|---|---|---|---|---|---|
| Example 1 | segment a | 1:3 | absent | 98 | 97 | 35 |
| Example 2 | segment b | 1:3 | absent | 99 | 99 | 32 |

TABLE 3-continued

| | Type of polyester segment in unsaturated polyurethane polymer*) | Weight ratio of polyester segment to polyether segment | Occurrence of tunnel in relief (depth of relief: 2.5 mm) | Retention of tensile properties (%) | Retention of hardness (%) | Impact resilience (%) |
|---|---|---|---|---|---|---|
| Comparative Example 1 | segment c | 1:3 | present (2 tunnels) | 78 | 80 | 33 |
| Example 3 | segment a | 1:1 | absent | 97 | 97 | 29 |
| Example 4 | segment b | 1:1 | absent | 99 | 99 | 28 |
| Comparative Example 2 | segment c | 1:1 | present (4 tunnels) | 81 | 79 | 29 |
| Example 5 | segment a | 1:1 | absent | 100 | 99 | 52 |
| Example 6 | segment b | 1:1 | absent | 100 | 99 | 50 |
| Example 7 | segment a | 1:1 | absent | 97 | 97 | 50 |
| Example 8 | segment a | 1:1 | absent | 98 | 98 | 58 |

*) Segment a: poly(3-methyl-1,5-pentanediol adipate)
Segment b: poly($\beta$-methyl-$\delta$-valerolactone)
Segment c: poly(propylene adipate)
polyether segment: polyoxyethylene-oxypropylene block copolymer

INDUSTRIAL APPLICABILITY

When the liquid photosensitive resin composition of the present invention is used for producing a relief structure, the occurrence of a tunnel phenomenon in the relief portions of a relief structure is suppressed, so that a relief structure having improved durability can be obtained. Also, the relief structure obtained has excellent light resistance. Further, the liquid photo-sensitive resin composition of the present invention has an advantage such that an uncured resin can be easily washed out from a photocured resin layer for development of a relief structure. The liquid photo-sensitive resin composition of the present invention can be advantageously employed especially for producing a printing plate, such as a flexographic printing plate for printing corrugated boards.

We claim:

1. A liquid photosensitive resin composition for use in forming a relief structure, comprising:

(A) 100 parts by weight of an unsaturated polyurethane prepolymer comprising a plurality of diol segments linked through a urethane linkage and having an addition-polymerizable ethylenically unsaturated group at both terminals thereof, said plurality of diol segments comprising at least one polyester diol segment and at least one polyether diol segment, wherein the weight ratio of said at least one polyester diol segment to said at least one polyether diol segment is from 1:3 to 4:1, and wherein each of said at least one polyester diol segment is independently a polyester diol segment comprising recurring units of a unit represented by the following formula (1):

wherein $R^1$ represents a divalent aliphatic group or a divalent aromatic group, or a polyester diol segment comprising recurring units of a unit represented by the following formula (2):

(B) 5 to 200 parts by weight, relative to 100 parts by weight of said polyurethane prepolymer (A), of an addition-polymerizable ethylenically unsaturated monomer, and (C) 0.01 to 10% by weight, based on the total weight of said component (A) and component (B), of a photopolymerization initiator.

2. The photosensitive resin composition according to claim 1, wherein said addition-polymerizable ethylenically unsaturated monomer (B) comprises an acrylate monomer represented by the following formula (3):

wherein $R^2$ is a straight chain or branched alkyl group having 2 to 22 carbon atoms, and n represents an integer of from 1 to 20, and said acrylate monomer is present in an amount of 17 to 65 parts by weight, relative to 100 parts by weight of said polyurethane prepolymer (A).

* * * * *